(12) United States Patent
Liu et al.

(10) Patent No.: US 12,052,820 B2
(45) Date of Patent: Jul. 30, 2024

(54) CONNECTION PAD AND SUBSTRATE

(71) Applicant: BOE TECHNOLOGY GROUP CO., LTD., Beijing (CN)

(72) Inventors: Zongmin Liu, Beijing (CN); Dongdong Zhang, Beijing (CN); Feng Qu, Beijing (CN); Jijing Huang, Beijing (CN); Mengjun Hou, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 286 days.

(21) Appl. No.: 17/429,067

(22) PCT Filed: Oct. 28, 2020

(86) PCT No.: PCT/CN2020/124395
§ 371 (c)(1),
(2) Date: Aug. 6, 2021

(87) PCT Pub. No.: WO2022/087891
PCT Pub. Date: May 5, 2022

(65) Prior Publication Data
US 2022/0312592 A1 Sep. 29, 2022

(51) Int. Cl.
*H05K 1/11* (2006.01)
*H05K 1/18* (2006.01)

(52) U.S. Cl.
CPC ............ *H05K 1/111* (2013.01); *H05K 1/181* (2013.01)

(58) Field of Classification Search
CPC .................................. H05K 1/111; H05K 1/181
USPC ........................................................ 361/767
See application file for complete search history.

(56) References Cited

U.S. PATENT DOCUMENTS

| 6,069,323 A | 5/2000 | Slupek et al. |
| 2013/0026530 A1* | 1/2013 | Jun .......................... G09F 13/22 257/E33.066 |
| 2013/0187816 A1* | 7/2013 | Chung ..................... H01Q 9/40 343/722 |
| 2013/0323526 A1 | 12/2013 | Hasin et al. |

(Continued)

FOREIGN PATENT DOCUMENTS

| CN | 106257965 A | 12/2016 |
| CN | 207783287 U | 8/2018 |

(Continued)

OTHER PUBLICATIONS

China Patent Office, CN202080002520.X First Office Action issued on May 20, 2023.

(Continued)

*Primary Examiner* — Stanley Tso
(74) *Attorney, Agent, or Firm* — HOUTTEMAN LAW LLC

(57) ABSTRACT

The present disclosure provides a connection pad and a substrate, and belongs to the field of display technology. The connection pad of the present disclosure includes a plurality of sub-pads and a first connection portion, wherein the plurality of sub-pads are spaced apart from each other and electrically connected through the first connecting portion. The connection pads in the embodiment of the present disclosure are formed by connecting the sub-pads through the first connection portion, that is, a certain gap exists between the sub-pads.

15 Claims, 13 Drawing Sheets

(56) References Cited

U.S. PATENT DOCUMENTS

| | | | |
|---|---|---|---|
| 2016/0037644 A1* | 2/2016 | Nakagawa | H05K 1/111 361/767 |
| 2017/0094789 A1 | 3/2017 | Park | |
| 2022/0030701 A1* | 1/2022 | Stollwerck | G01R 1/18 |

FOREIGN PATENT DOCUMENTS

| | | | |
|---|---|---|---|
| CN | 110213880 A | | 9/2019 |
| CN | 110933836 A | * | 11/2019 |
| CN | 110933836 A | | 3/2020 |
| CN | 111564455 A | | 8/2020 |
| JP | 2000040715 A | | 3/2000 |

OTHER PUBLICATIONS

China Patent Office, CN202080002520.X Second Office Action issued on Nov. 16, 2023.

\* cited by examiner

CONNECTION PAD AND SUBSTRATE

CROSS-REFERENCE TO RELATED APPLICATIONS

This is a National Phase Application filed under 35 U.S.C. 371 as a national stage of PCT/CN2020/124395, filed on Oct. 28, 2020.

TECHNICAL FIELD

The present disclosure relates to the field of electronic device technology, and particularly relates to a connection pad and a substrate.

BACKGROUND

Patterning a metal on a base substrate to implement a product with some special applications is becoming increasingly popular, and transparent flexible antennas are one of the potential application scenarios. Considering the selection of the base substrate in a special application scenario, it is generally difficult to achieve signal transmission through a conventional electrical connector in a soldering manner, and bonding is a solution.

SUMMARY

The present disclosure is directed to at least one of the problems in the prior art, and provides a connection pad and a substrate.

In a first aspect, embodiments of the present disclosure provide a connection pad including a plurality of sub-pads and a first connection portion, wherein the plurality of sub-pads are spaced apart from each other and electrically connected by the first connecting portion.

In an embodiment, the plurality of sub-pads are arranged side by side in a first direction and extend in a second direction,
- each of the plurality of sub-pads includes a first end and a second end opposite to each other along the second direction, and
- the first end of each of the plurality of sub-pads is electrically connected to the first connection portion.

In an embodiment, at least some of the plurality of sub-pad portions have different widths along the first direction.

In an embodiment, at least some sub-pads adjacently arranged of the plurality of sub-pads are connected by a second connection portion, and there is a gap between the second connection portion and the first connection portion.

In an embodiment, a number of the second connection portion connected between the sub-pads adjacently arranged is plural, and the plural second connection pads are spaced apart from each other.

In an embodiment, a third connection portion is provided between at least some sub-pads adjacently arranged among the plurality of sub-pads, and the third connection portion is spaced apart from the at least some sub-pads adjacently arranged.

In an embodiment, at least a part of corners of the connection pad are arc-shaped.

In an embodiment, the plurality of sub-pads define a first opening together with the first connection portion; and at least a part of inner corners of the first opening is arc-shaped.

In an embodiment, the first connection portion includes a first sub-connection portion extending in a first direction and a second sub-connection portion extending in a second direction;
the first sub-connection portion is connected with each of the plurality of sub-pads, and the second sub-connection portion is connected with the first sub-connection portion; and
a width of the second sub-connection portion in the first direction is smaller than a length of the first sub-connection portion in the first direction.

In an embodiment, the first sub-connection portion includes a first side and a second side opposite to each other and extending in the first direction, and a third side and a fourth side opposite to each other and extending in the second direction, the first side of the first sub-connection portion being connected to the second sub-connection portion;
- a corner formed by connection between the first and third sides of the first sub-connection portion and a corner formed by connection between the first and fourth sides of the first sub-connection portion are arc-shaped, and/or
- a corner formed by connection between the first sub-connection portion and the second sub-connection portion is arc-shaped.

In an embodiment, the plurality sub-pads and first connection portion are formed as a single piece.

In an embodiment, a number of the plurality sub-pads is two or three.

In a second aspect, embodiments of the present disclosure provide a substrate having a bonding area and a function area, the substrate including a base substrate and a connection pad on the base substrate and in the bonding area, wherein the connection pad is the connection pad according to the embodiments.

In an embodiment, the substrate is an antenna substrate, the substrate further includes a radiation patch on the base substrate and in the function area, and the radiation patch is electrically connected to the connection pad.

DETAILED DESCRIPTION

In order to make those skilled in the art better understand the technical solutions of the present disclosure, the present disclosure is further described in detail below with reference to the accompanying drawings and the detailed description.

Unless defined otherwise, technical or scientific terms used in the present disclosure shall have the ordinary meaning as understood by one of ordinary skill in the art to which the present disclosure belongs. The terms "first," "second," and the like as used in the present disclosure are not intended to indicate any order, quantity, or importance, but rather to distinguish one element from another. Also, the term "a," "an," or "the" and similar term do not denote a limitation of quantity, but rather denote the presence of at least one. The term "comprise" or "include", or the like, means that the element or item preceding the term comprises the element or item listed after the term and its equivalent, but does not exclude other elements or items. The term "connected" or "coupled" or the like is not restricted to physical or mechanical connections, but may include electrical connections, whether direct or indirect. The terms "upper", "lower", "left", "right", and the like are used only to indicate relative positional relationships, and when the absolute position of the object being described is changed, the relative positional relationships may also be changed accordingly.

It should be noted that a first direction and a second direction mentioned in the embodiments of the present disclosure intersect with each other, and for example, they may be perpendicular.

Figure 1:
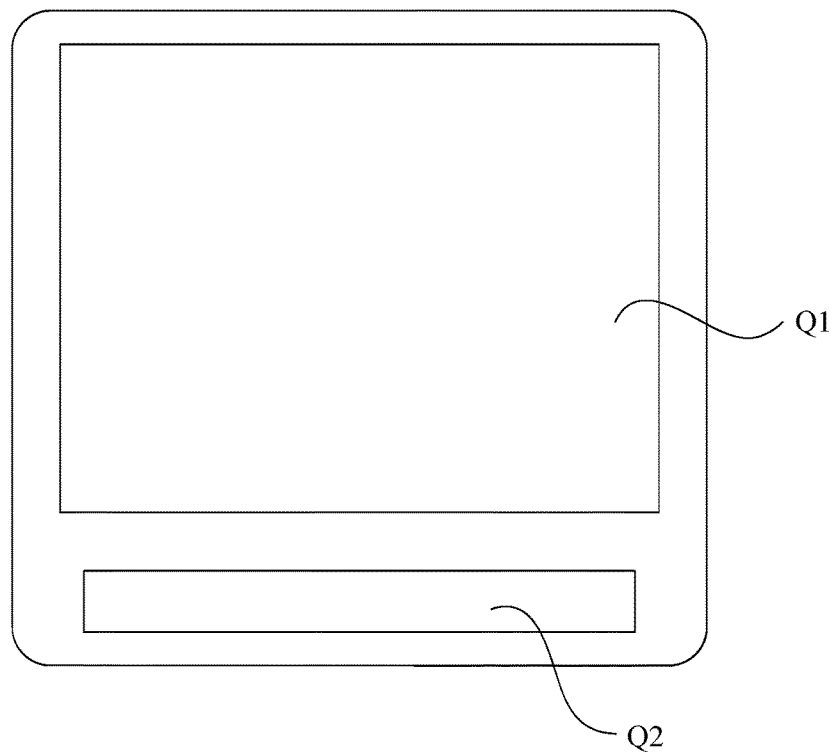
FIG. 1 is a schematic structural diagram of an exemplary substrate.

FIG. 1 is a schematic diagram of an exemplary substrate. As shown in FIG. 1, the substrate is divided into a function area Q1 and a bonding area Q2 located at a side of the function area Q1. For the function area Q1, corresponding functional structures are provided according to the type of the substrate. For example, the substrate is a display substrate, and the function area Q1 is provided with a pixel structure; the substrate is an antenna substrate, and the function area Q1 is provided with a radiation structure. For the bonding area Q2, a plurality of connection pads 210 are arranged side by side, and are configured to connect with connection pads 22 on a signal circuit board (such as a flexible printed circuit (FPC) board or a printed circuit board (PCB)) by bonding to provide signals to the functional structures of the function area Q1 or to lead out signals from the function area Q1.

Figure 2:
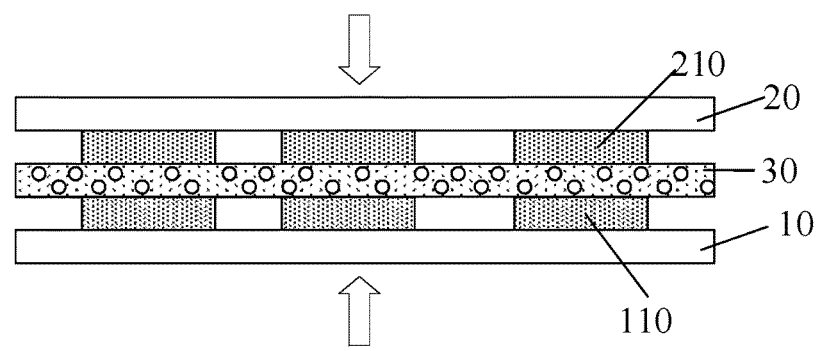
FIG. 2 is a schematic diagram of a substrate before bonding.
Figure 3:
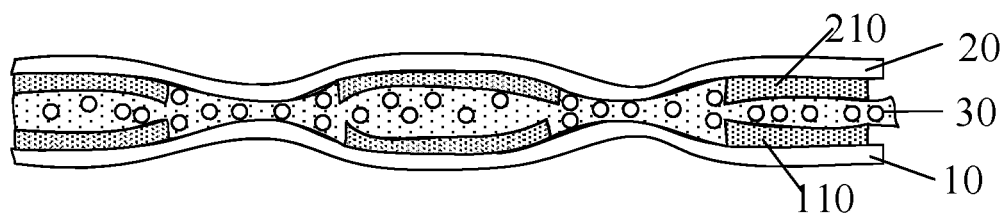
FIG. 3 is a schematic diagram of the substrate of FIG. 2 after bonding.

FIG. 2 is a schematic diagram of a substrate before bonding. FIG. 3 is a schematic diagram of the substrate of FIG. 2 after bonding. Referring to FIGS. 2 and 3, the substrate includes a base substrate 10 and connection pads 110 formed at positions corresponding to the bonding areas. The signal circuit board includes a base substrate 20 having connection pads 210 formed thereon. An ACF (anisotropic conductive film) adhesive is formed between the connection pads 110 and the connection pads 210. The base substrate 10 and the base substrate 20 are pressed by an upper pressure head and a lower pressure head, respectively, so that the connection pads 110 and the connection pads 210 are bonded together by the ACF adhesive. The inventor found that, a case where a substrate is an antenna substrate is taken as an example, for example, the antenna substrate is a substrate applied to a CPE (customer premise equipment) antenna, for the bonding area Q2, signals are led out through the connection pads 110, and the bonding area Q2 needs to satisfy a requirement of drawing force of 7N/cm, which requires that the width of the connection pad 110 of the bonding area Q2 is as wide as possible to increase the contact area. Meanwhile, if transmission impedance of 50Ω of the RF (radio frequency) signal is to be ensured, the line width of the connection pad 110 often needs to be designed to be very thick (several hundreds of micrometers). The bonding area Q2 needs to satisfy the requirements of common bonding process. For example, only when the width of the connection pad 110 and the distance between the connection pads 110 do not exceed 50 um, can the problem that the ACF adhesive is overflowed when the connection pads 110 on the substrate and the connection pads 210 on the signal circuit board are bonded by the ACF adhesive 30 (transparent conductive adhesive) be solved. However, in a case where the connection pads 110 on the substrate are wide (more than 200 μm), when the ACF adhesive 30 is used for bonding, the ACF adhesive 30 overflows into the gaps between the connection pads, and the conductive gold balls in the ACF adhesive 30 in the gaps are pressed against the sides of the connection pads 110/210 due to the narrow gaps, which results in that the connection pads 110/210 are deformed and arched (like a "lid") as shown in FIG. 3, and the conductive gold balls in the ACF adhesive 30 at the connection pads 110/210 are cracked, thereby affecting the signal transmission and the pass of drawing force test.

In view of the above technical problems, embodiments of the present disclosure provide the following technical solutions.

Figure 4:
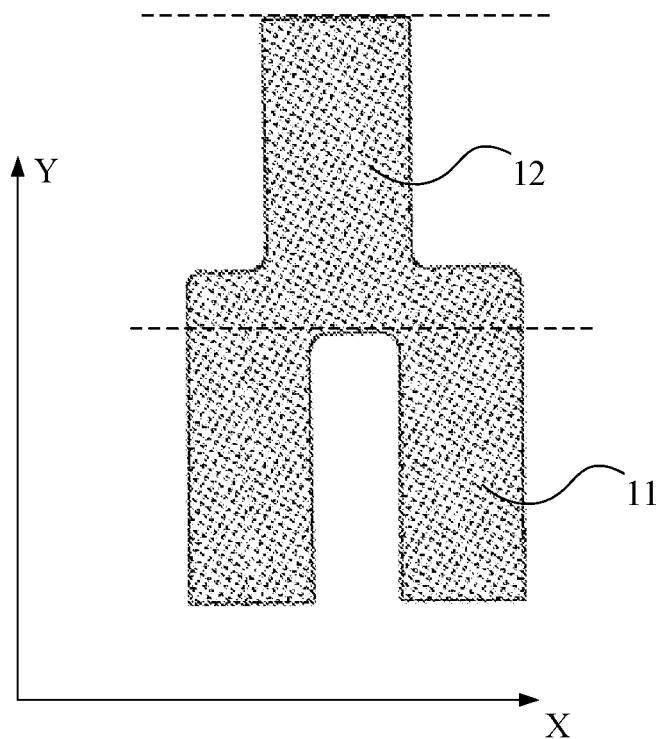
FIG. 4 is a schematic diagram of a connection pad according to an embodiment of the disclosure.

In a first aspect, FIG. 4 is a schematic diagram of a connection pad according to an embodiment of the present disclosure. As shown in FIG. 4, the present disclosure provides a connection pad including a plurality of sub-pads 11 and a first connection portion 12, and the sub-pads 11 are spaced apart from each other and connected by the first connection portion 12.

The connection pad in the embodiment of the present disclosure is formed by connecting the sub-pads 11 spaced apart from each other through the first connection portion 12, that is, a certain gap exists between the sub-pads 11. For the connection pad itself, a hollow area is provided thereon, so that when the connection pads are applied to the substrate and are bonded with connection pads on another signal circuit board through the ACF adhesive, the gap between the sub-pads 11 provides an overflowing space for the ACF adhesive, thereby effectively avoiding the problem of defective bonding of connection pads caused by the connection pads that are arched due to the fact that gold balls in the ACF adhesive are pressed against the connection pads because of the too large width of the pads.

In some embodiments, the sub-pads 11 are arranged side by side in a first direction and extend in a second direction. Each of the sub-pads 11 includes a first end and a second end opposite to each other in the second direction; the first end of each sub-pad 11 is electrically connected to the first connection portion 12. Of course, each sub-pad 11 is not limited to be connected to the first connection portion 12 through its first end. For example, the first connection portion 12 is connected to the middle area of each sub-pad 11, or connected to the second end of each sub-pad 11, or the first ends of some sub-pads 11 are connected to the first connection portion 12, and the second ends of the other sub-pads 11 are connected to the first connection portion 12, so as to achieve the electrical connection between the sub-pads 11.

In an embodiment of the present disclosure, the number of the sub-pads 11 of the connection pad may be two, three, or even more, and the number of the sub-pads 11 is not limited in the embodiment of the present disclosure. In the following description, the number of the sub-pads 11 is two or three as an example for explanation. For convenience of description, in a case where the number of the sub-pads 11 is two, the two sub-pads 11 arranged in the first direction are referred to as a first sub-pad 111 and a second sub-pad 112, respectively; in a case where the number of the sub-pads 11 is three, the three sub-pads 11 arranged in the first direction are referred to as a first sub-pad 111, a second sub-pad 112, and a third sub-pad 113, respectively.

Figure 5:
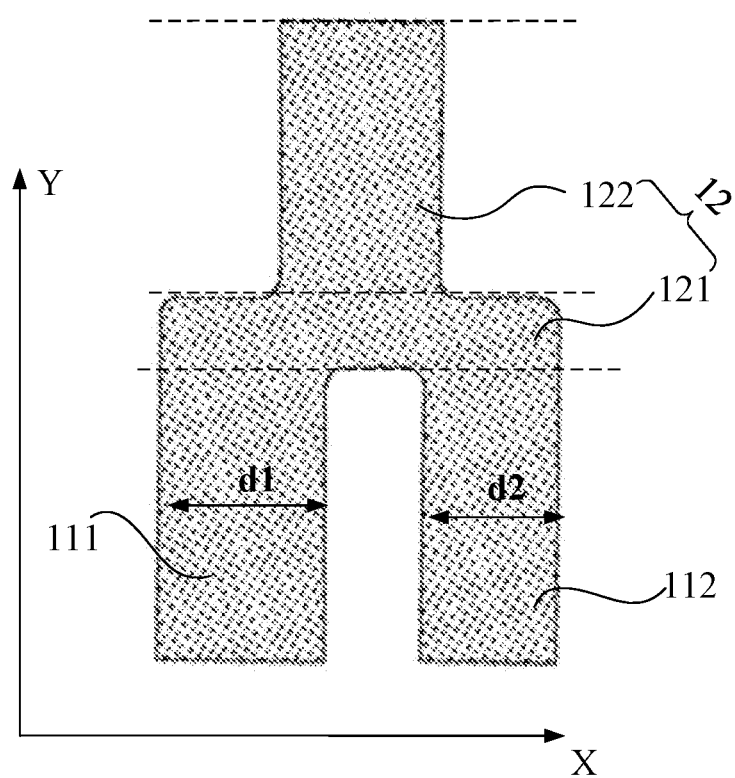
FIG. 5 is a schematic diagram of another connection pad according to an embodiment of the present disclosure.

In one example, FIG. 5 is a schematic diagram of a connection pad according to an embodiment of the present disclosure. As shown in FIG. 5, the connection pad includes two sub-pads 11 and one first connection portion 12; the two sub-pads 11 are referred to as a first sub-pad 111 and a second sub-pad 112, respectively, and the first connection portion 12 is connected to first ends of the first sub-pad 111 and the second sub-pad 112. The widths of the first sub-pad 111 and the second sub-pad 112 in the first direction are different from each other, and FIG. 5 illustrates that the width d1 of the first sub-pad 111 in the first direction is greater than the width d2 of the second sub-pad 112 in the first direction, but actually, the width d2 of the second sub-pad 112 in the first direction may be greater than the width d1 of the first sub-pad 111 in the first direction. In this case, even if a misalignment occurs in the bonding process, good electrical connection can be achieved by connecting the connection pads on the signal circuit board with the sub-pad of the sub-pads 11 having a larger width at this time. It should be noted that the size of the misalignment of the bonding process is much smaller than the width of the sub-pad 11 in the first direction.

With continued reference to FIG. 5, the first connection portion 12 of the connection pad includes a first sub-connection portion 121 extending in the first direction and a second sub-connection portion 122 extending in the second direction. The first sub-connection portion 121 includes a first side and a second side extending along the first direction and disposed opposite to each other, and a third side and a fourth side extending along the second direction and disposed opposite to each other. The first side of the first sub-connection portion 121 is connected to the first ends of the first and second sub-pads 111 and 112, and the second side of the first sub-connection portion 121 is connected to the second sub-connection portion 122. In addition, the length of the first sub-connection 121 in the first direction is greater than the width of the second sub-connection 122 in the first direction.

With continued reference to FIG. 5, the first sub-pad 111 and the second sub-pad 112 are spaced apart and define a first opening with the second side of the first sub-connection portion 121. The first opening are defined by three sides, so the first opening has two inner corners, and the inner corners of the first opening are arc-shaped. The corners formed by the connection between the second sub-connection portion 122 and the first side of the first sub-connection portion 121 are arc-shaped. The corner formed by the connection between the first and third sides and the corner formed by the connection between the first and fourth sides of the first sub-connection portion 121 are arc-shaped. The arc design is adopted for part of corners to reduce the impedance change at the corners, thereby effectively reducing the reflection of signals (such as radio frequency signals).

In addition, it should be noted that, in FIG. 5, the widths of the first sub-pad 111 and the second sub-pad 112 along the first direction are different from each other, and in an actual design, the widths of the first sub-pad 111 and the second sub-pad 112 along the first direction may also be the same, all of which are within the protection scope of the embodiments of the present disclosure.

Figure 6:
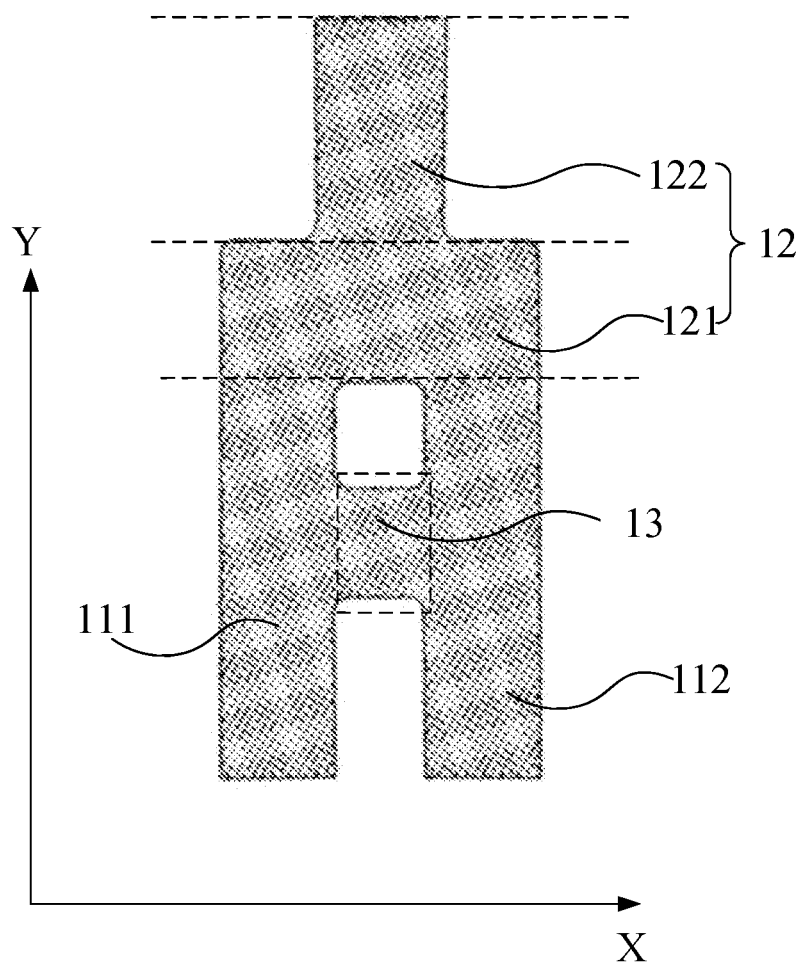
FIG. 6 is a schematic diagram of another connection pad according to an embodiment of the present disclosure.

In another example, FIG. 6 is a schematic diagram of another connection pad according to an embodiment of the present disclosure. As shown in FIG. 6, the connection pad has substantially the same structure as the connection pad shown in FIG. 5, except that the connection pad includes not only the structure of FIG. 5 but also the second connection portion 13. The second connection portion 13 connects the first sub-pad 111 and the second sub-pad 112, and there is a certain distance between the second connection portion 13 and the first connection portion 12, that is, the first connection portion 12 and the second connection portion 13 do not contact directly. The first sub-pad 111 and the second sub-pad 112 are further connected by the second connection portion 13, so that the connection pad on the substrate can be well bonded and connected with the connection pad on the signal circuit board.

Figure 7:
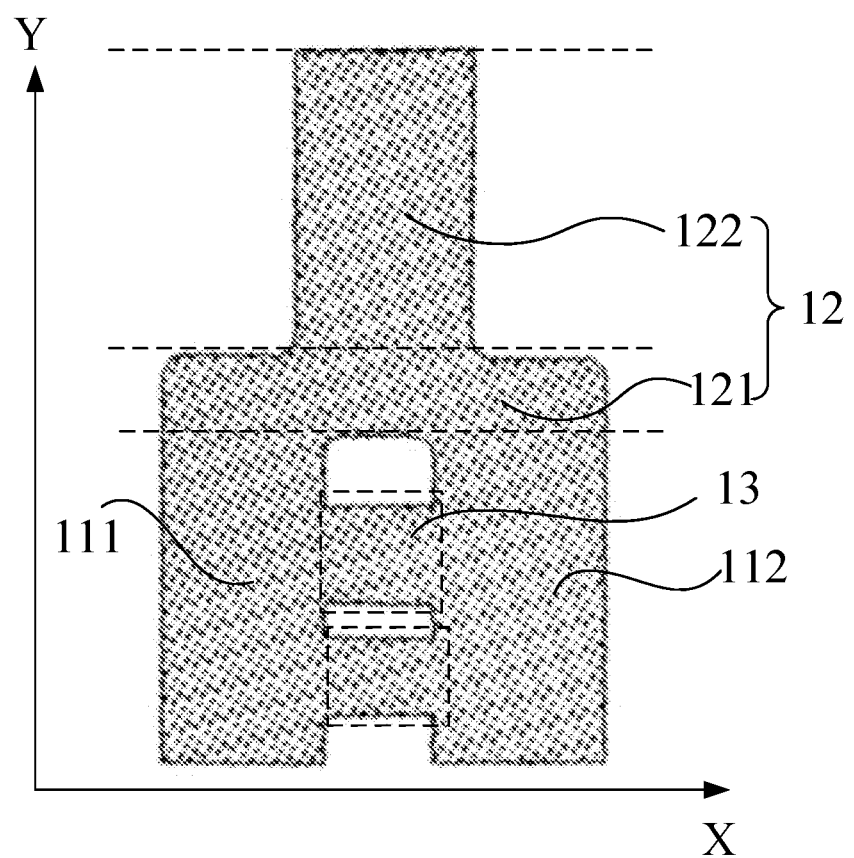
FIG. 7 is a schematic diagram of another connection pad according to an embodiment of the present disclosure.

In another example, FIG. 7 is a schematic diagram of another connection pad according to an embodiment of the present disclosure. As shown in FIG. 7, the connection pad has substantially the same structure as the connection pad shown in FIG. 6, except that the number of the second connection portions 13 in FIG. 6 is one, the number of the second connection portions 13 in FIG. 7 is two, and the two second connection portions 13 are arranged at an interval. It can be understood that the greater the number of the second connecting portions 13, the better the bonding and the connection between the connection pads on the substrate and the connection pads on the signal circuit board. It should be noted that FIG. 6 and FIG. 7 illustrate that the number of the second connection portions 13 is one and two, respectively, and the number of the second connection portions 13 may be more in practical applications, and the number of the second connection portions 13 is not limited in the embodiment of the present disclosure.

Figure 8:
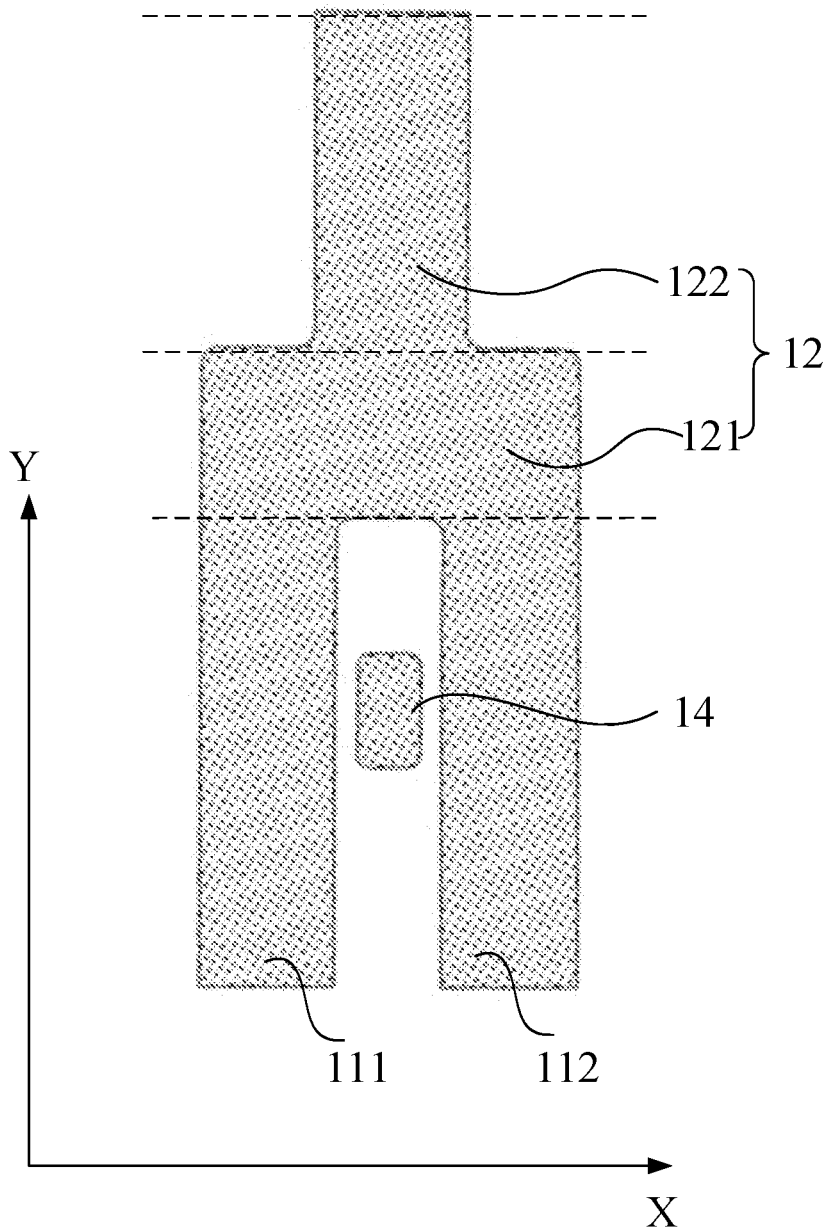
FIG. 8 is a schematic diagram of another connection pad according to an embodiment of the present disclosure.

In another example, FIG. 8 is a schematic diagram of another connection pad according to an embodiment of the present disclosure. As shown in FIG. 8, the connection pad has substantially the same structure as the connection pad shown in FIG. 5, except that the connection pad includes not only the structure of FIG. 5 but also a third connection portion 14 disposed between the first sub-pad 111 and the second sub-pad 112, and the third connection portion 14 is disposed spaced apart from the first sub-pad 111 and the second sub-pad 112. The third connection portion 14 is provided to increase the adhesiveness of the ACF adhesive between the connection pad on the substrate and the connection pad on the signal circuit board. In the embodiment of the present disclosure, the number of the third connection portions 14 is not limited, and the number and the size of the third connection portion(s) 14 may be determined according to the interval between the first sub-pad 111 and the second sub-pad 112.

Figure 9:
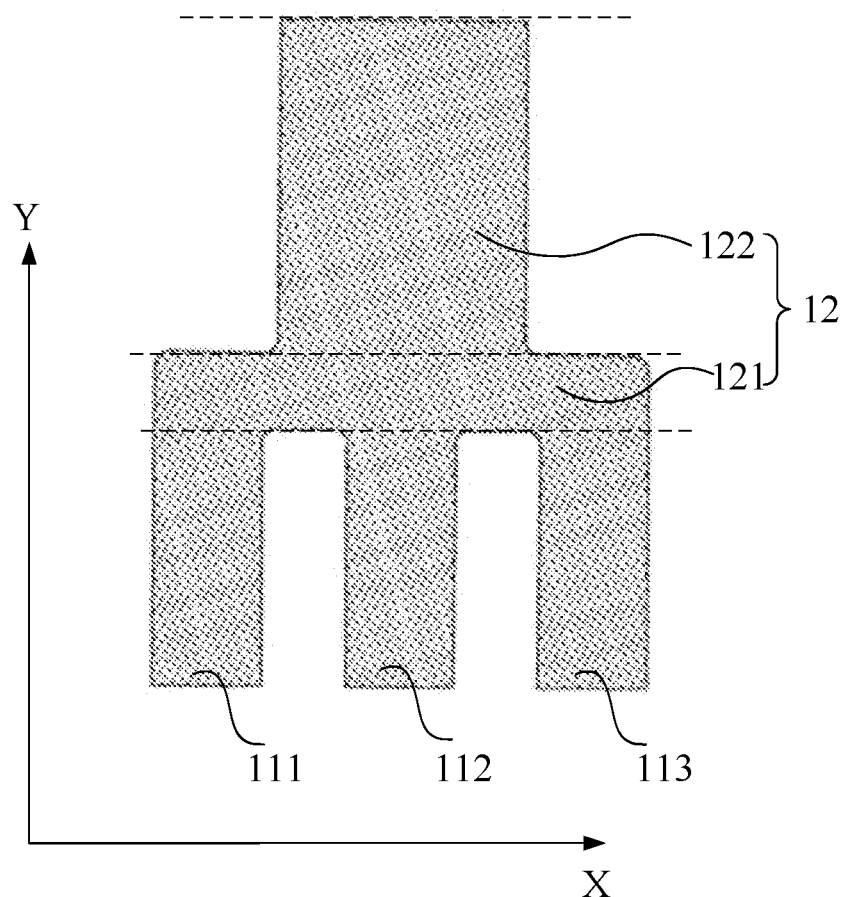
FIG. 9 is a schematic diagram of another connection pad according to an embodiment of the present disclosure.

In another embodiment, FIG. 9 is a schematic diagram of another connection pad according to an embodiment of the present disclosure. As shown in FIG. 9, the connection pad has substantially the same structure as the connection pad shown in FIG. 5, except that the connection pad includes three sub-pads 11, i.e., a first sub-pad 111, a second sub-pad 112, and a third sub-pad 113, and other structures are the same as the connection pad of FIG. 5, and thus a description thereof will not be repeated.

Figure 10:
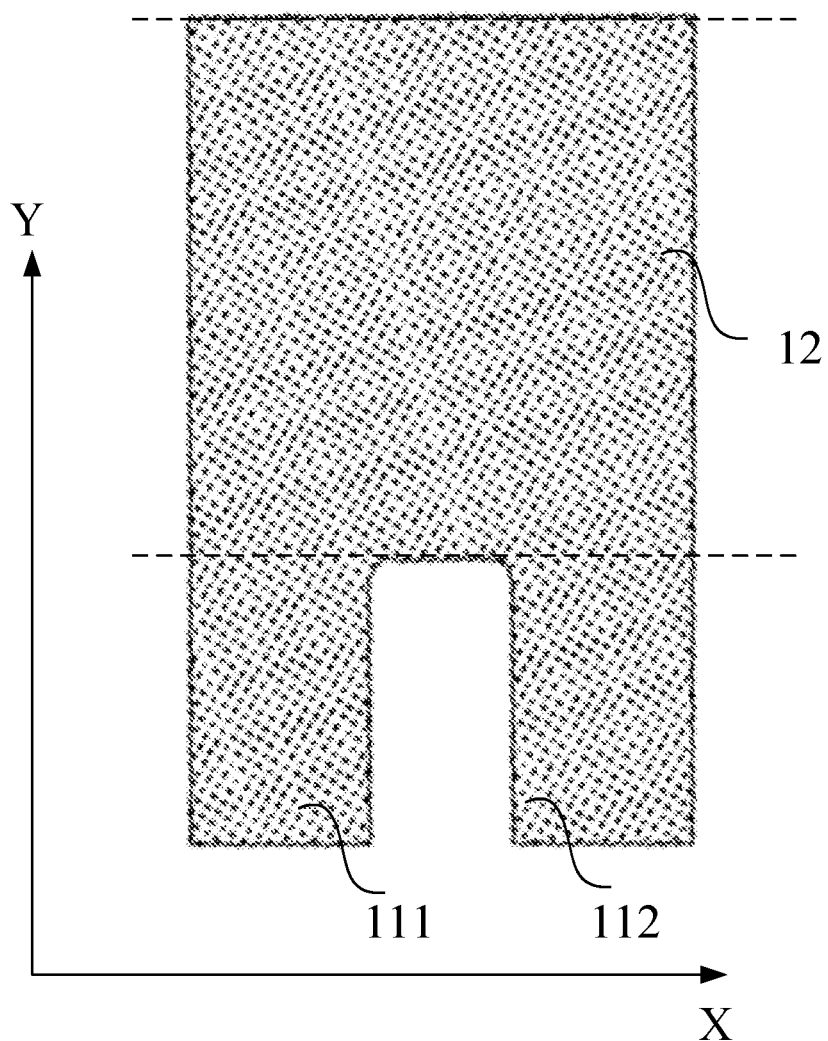
FIG. 10 is a schematic diagram of another connection pad according to an embodiment of the present disclosure.

In another example, FIG. 10 is a schematic diagram of another connection pad according to an embodiment of the present disclosure. As shown in FIG. 10, the connection pad has substantially the same structure as the connection pad shown in FIG. 5, except that the first connection portion 12 has a different structure, and the first connection portion 12 of the connection pad of FIG. 10 has a block-shaped structure to connect the first sub-pad 111 and the second sub-pad 112. As shown in FIG. 10, the first sub-pad 111 and the second sub-pad 112 have the same width in the first direction.

Figure 11:
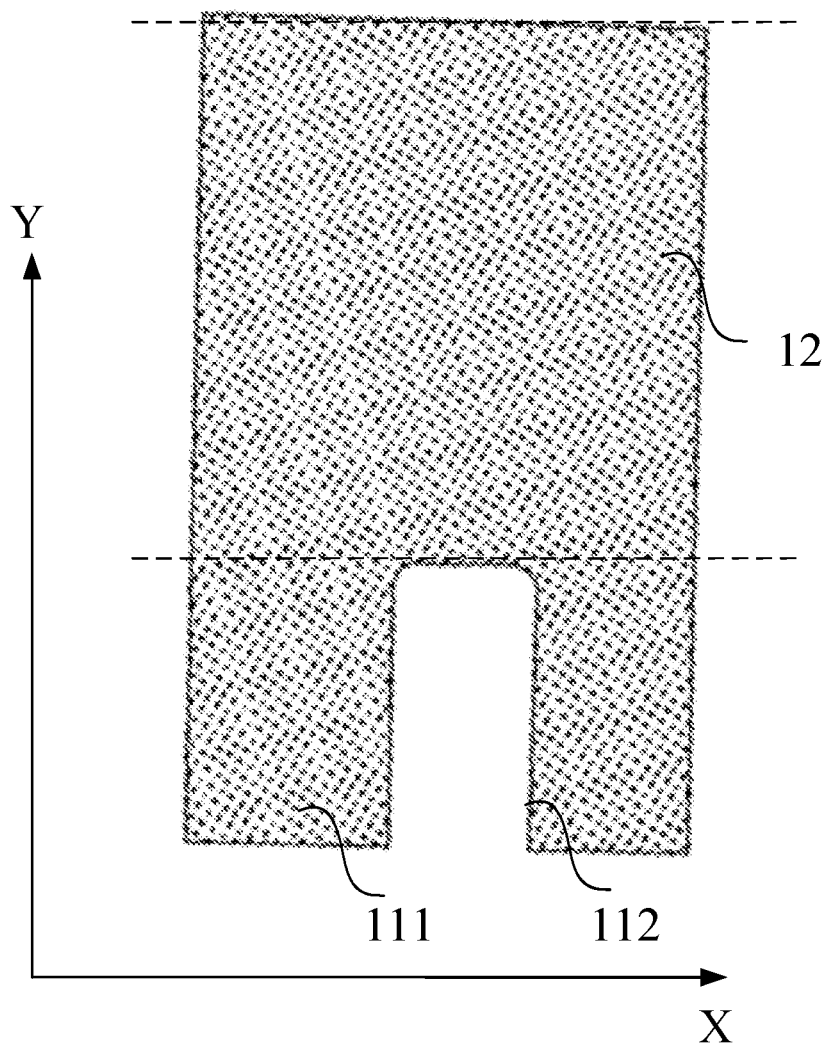
FIG. 11 is a schematic diagram of another connection pad according to an embodiment of the present disclosure.

In another example, FIG. 11 is a schematic diagram of another connection pad according to an embodiment of the present disclosure. As shown in FIG. 11, the connection pad has substantially the same structure as the connection pad shown in FIG. 10 except that the first sub-pad 111 and the second sub-pad 112 have different widths in the first direction. In addition, it should be noted that the widths of the first sub-pad 111 and the second sub-pad 112 in the first direction in FIG. 11 are different from each other, and in practical design, the widths of the first sub-pad 111 and the second sub-pad 112 in the first direction may also be the same, all of which are within the protection scope of the embodiments of the present disclosure.

Figure 12:
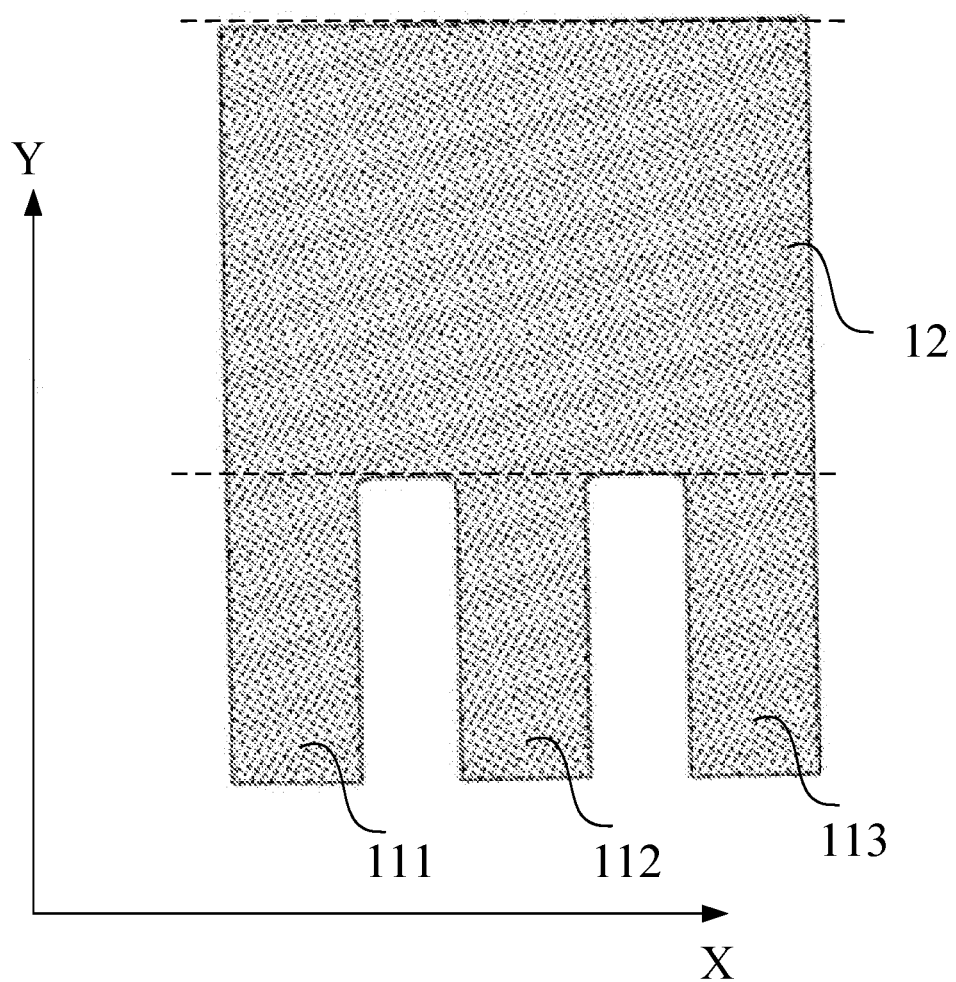
FIG. 12 is a schematic diagram of another connection pad according to an embodiment of the present disclosure.

In another example, FIG. 12 is a schematic diagram of another connection pad according to an embodiment of the present disclosure. As shown in FIG. 12, the connection pad has substantially the same structure as the connection pad shown in FIG. 10, except that the connection pad includes three sub-pads 11, i.e., a first sub-pad 111, a second sub-pad 112, and a third sub-pad 113, and a distance between the first sub-pad 111 and the second sub-pad 112 is equal to a distance between the second sub-pad 112 and the third sub-pad 113.

Figure 13:
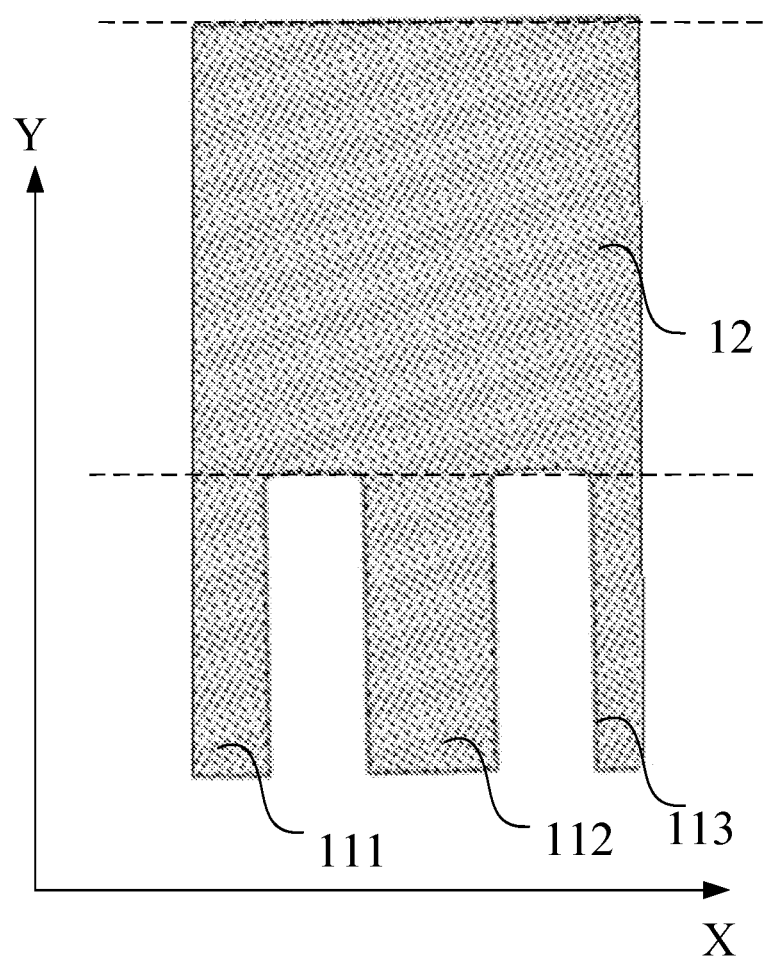
FIG. 13 is a schematic diagram of another connection pad according to an embodiment of the present disclosure.

In another example, FIG. 13 is a schematic diagram of another connection pad according to an embodiment of the present disclosure. As shown in FIG. 13, the connection pad has substantially the same structure as the connection pad shown in FIG. 12, except that the connection pad includes three sub-pads 11, i.e., a first sub-pad 111, a second sub-pad 112, and a third sub-pad 113, and the first sub-pad 111, the second sub-pad 112, and the third sub-pad 113 have different widths or partially different widths.

In some embodiments, in the implementation of each of the above connection pads, each sub-pad 11 and the first connection portion 12 may be formed as a single piece. For the connection pad having the second connection portion 13, each sub-pad 11, the first connection portion 12 and the second connection portion 13 may be formed as a single piece.

In some embodiments, at least some corners of the connection pads are arc-shaped to reduce reflection of signals. In one embodiment, all of the corners of the connection pad are arc-shaped.

In the embodiments of the present disclosure, the connection pad is formed by connecting the sub-pads 11 spaced apart from each other through the first connection portion 12, that is, a certain gap exists between the sub-pads 11. For the connection pad itself, a hollow area is provided thereon, so that when the connection pads are applied to the substrate and are bonded with connection pads on another signal circuit board through the ACF adhesive, the gap between the sub-pads 11 provides an overflowing space for the ACF adhesive, thereby effectively avoiding the problem of defective bonding of the connection pads caused by the connection pads that are arched due to the fact that gold balls in the ACF adhesive are pressed against the connection pads because of the too small distance between adjacent pads.

In a second aspect, an embodiment of the present disclosure provides a substrate divided into a function area Q1 and a bonding area Q2 surrounding the function area Q1. The substrate includes a base substrate and a connection pad disposed on the base substrate and located in the bonding area Q2. The connection pad may be any one of the connection pads described above.

Figure 14:
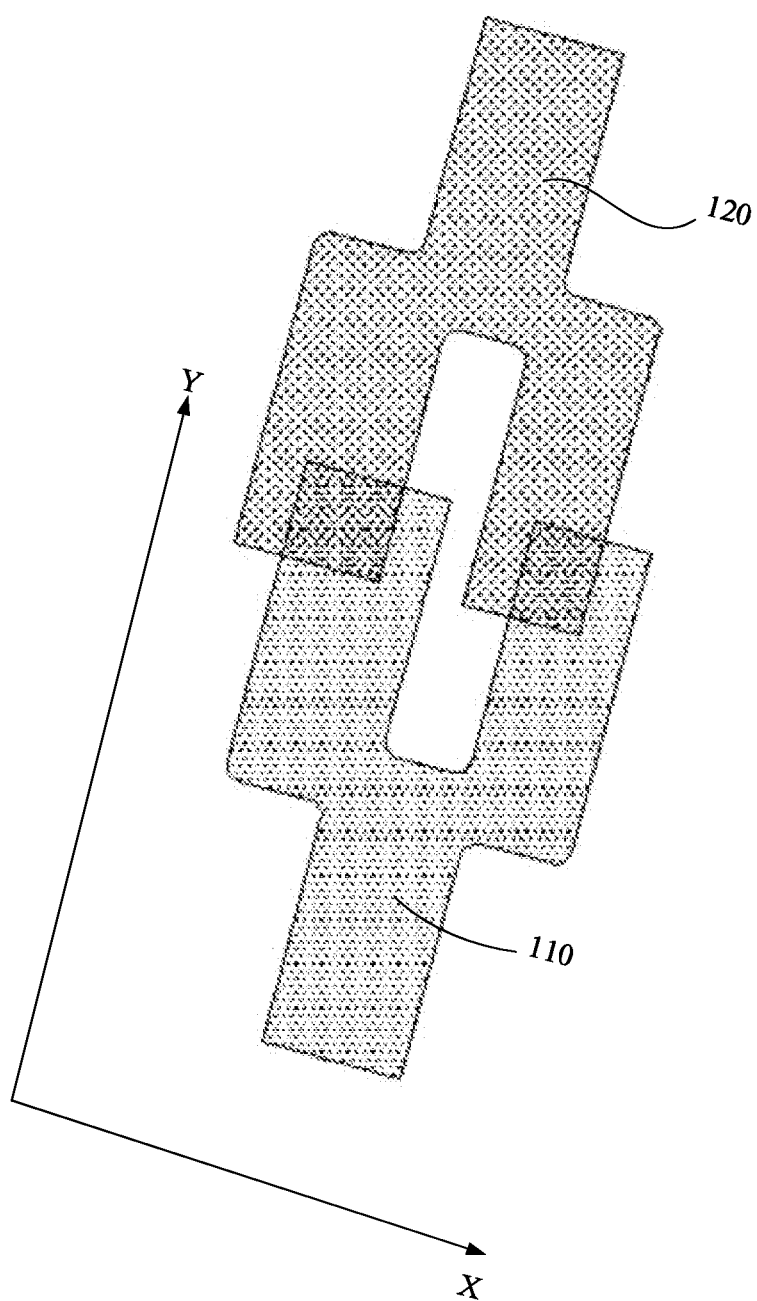
FIG. 14 is a schematic diagram of bonding connection pads in a substrate according to an embodiment of the disclosure.

It should be understood that FIG. 14 is a schematic diagram of bonding connection pads in a substrate according to an embodiment of the disclosure. As shown in FIG. 14, the substrate further includes a signal circuit board such as a flexible printed circuit board or a printed circuit board. The connection pads 120 on the signal circuit board and the connection pads 110 on the base substrate should be arranged in a one-to-one correspondence, the structures of the connection pads 120 and the connection pads 110 on the base substrate may be consistent, and in the embodiment of the present disclosure, the description is given by taking a case where the connection pads 120 on the signal circuit board and the connection pads 110 on the base substrate are consistent in structure as an example.

Figure 15:
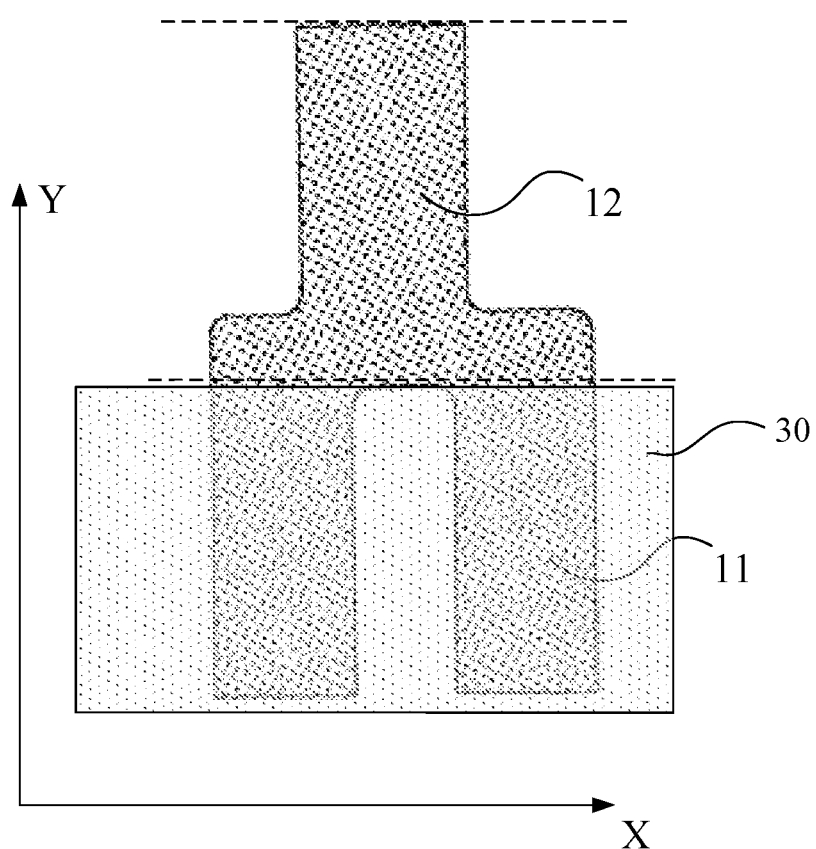
FIG. 15 is a schematic diagram illustrating positions of an ACF adhesive and a connection pad in a substrate according to an embodiment of the present disclosure.

In some embodiments, FIG. 15 is a schematic diagram illustrating positions of an ACF adhesive and a connection pad in the substrate according to an embodiment of the present disclosure. As shown in FIG. 15, when the connection pads on the signal circuit board and the connection pads provided on the base substrate are bonded and connected by the ACF adhesive 30, the width of the ACF adhesive 30 in the second direction is the same as or substantially the same as the width of the sub-pads 11 in the second direction.

The substrate in the embodiment of the present disclosure may be an antenna substrate, for example, a CPE antenna substrate. The function area Q1 of the base substrate is further provided with radiation patches, the radiation patches are connected to the connection pads in a one-to-one correspondence, and specifically, the radiation patches and the connection pads may be connected through signal lines.

In some embodiments, the material of the radiating patch may be a transparent conductive material, such that the formed antenna is a transparent antenna.

In some embodiments, the base substrate includes, but is not limited to, a flexible substrate.

Of course, the substrate in the embodiment of the present disclosure is not limited to the antenna substrate, and may also be a display substrate. In this case, the connection pad is configured to provide an electrical signal for the pixel structure in the function area Q1 of the display substrate. The connection pad in the embodiment of the present disclosure may be applied to various substrates that require connection by bonding process, and the type of the substrate is not limited herein.

It could be understood that the above embodiments are merely exemplary embodiments adopted for describing the principle of the present disclosure, but the present disclosure is not limited thereto. Various variations and improvements may be made by those of ordinary skill in the art without departing from the spirit and essence of the present disclosure, and these variations and improvements shall also be regarded as falling into the protection scope of the present disclosure.

What is claimed is:

1. A substrate having a bonding area and a function area, wherein
in the bonding area, the substrate comprises a first connection pad on a signal circuit board and a second connection pad on a base substrate,
each of the first connection pad and the second connection pad comprises
a plurality of sub-pads and a first connection portion, wherein the plurality of sub-pads of each of the first connection pad and the second connection pad are spaced apart from each other and electrically connected by the first connection portion,
the plurality of sub-pads of each of the first connection pad and the second connection pad are arranged side by side in a first direction and extend in a second direction,
the first direction is perpendicular to the second direction,
and at least some of the plurality of sub-pads of each of the first connection pad and the second connection pad have different widths with each other along the first direction,
and the plurality of sub-pads of the first connection pad and the plurality of sub-pads of the second connection pad are bonded and connected by an anisotropic conductive film adhesive,
a width of the anisotropic conductive film adhesive in the second direction is the same as a width of each of the plurality of sub-pads of the first connection pad and the plurality of sub-pads of the second connection pad in the second direction.

2. The substrate of claim 1, wherein
each of the plurality of sub-pads of each of the first connection pad and the second connection pad comprises a first end and a second end opposite to each other along the second direction, and
the first end of each of the plurality of sub-pads of each of the first connection pad and the second connection pad is electrically connected to the first connection portion.

3. The substrate of claim 1, wherein at least some sub-pads adjacently arranged among the plurality of sub-pads of each of the first connection pad and the second connection pad are connected by a second connection portion, and there is a gap between the second connection portion and the first connection portion.

4. The substrate of claim 3, wherein a number of the second connection portion connected between the sub-pads adjacently arranged is plural, and the plural second connection portions are spaced apart from each other.

5. The substrate of claim 1, wherein at least a part of corners of each of the first connection pad and the second connection pad are arc-shaped.

6. The substrate of claim 1, wherein the plurality of sub-pads of each of the first connection pad and the second connection pad define a first opening together with the first connection portion; and at least a part of inner corners of the first opening is arc-shaped.

7. The substrate of claim 1, wherein the first connection portion of each of the first connection pad and the second connection pad comprises a first sub-connection portion extending in the first direction and a second sub-connection portion extending in the second direction;
the first sub-connection portion is connected with each of the plurality of sub-pads, and the second sub-connection portion is connected with the first sub-connection portion; and
a width of the second sub-connection portion in the first direction is smaller than a length of the first sub-connection portion in the first direction.

8. The substrate of claim 7, wherein the first sub-connection portion comprises a first side and a second side opposite to each other and extending in the first direction, and a third side and a fourth side opposite to each other and extending in the second direction, the first side of the first sub-connection portion being connected to the second sub-connection portion; and
a corner formed by connection between the first and third sides of the first sub-connection portion and a corner formed by connection between the first and fourth sides of the first sub-connection portion are arc-shaped.

9. The substrate of claim 7, wherein the first sub-connection portion comprises a first side and a second side opposite to each other and extending in the first direction, and a third side and a fourth side opposite to each other and extending in the second direction, the first side of the first sub-connection portion being connected to the second sub-connection portion;
a corner formed by connection between the first and third sides of the first sub-connection portion and a corner formed by connection between the first and fourth sides of the first sub-connection portion are arc-shaped, and
a corner formed by connection between the first sub-connection portion and the second sub-connection portion is arc-shaped.

10. The substrate of claim 7, wherein the first sub-connection portion comprises a first side and a second side opposite to each other and extending in the first direction, and a third side and a fourth side opposite to each other and extending in the second direction, the first side of the first sub-connection portion being connected to the second sub-connection portion; and
a corner formed by connection between the first sub-connection portion and the second sub-connection portion is arc-shaped.

11. The substrate of claim 1, wherein the plurality sub-pads of each of the first connection pad and the second connection pad and the first connection portion are formed as a single piece.

12. The substrate of claim 1, wherein a number of the plurality sub-pads of each of the first connection pad and the second connection pad is two or three.

13. The substrate of claim 1, wherein the substrate is an antenna substrate, the substrate further comprises a radiation patch on the base substrate and in the function area, and the radiation patch is electrically connected to the connection pad.

14. The substrate of claim 1, wherein the plurality of sub-pads comprises of each of the first connection pad and the second connection pad three sub-pads spaced apart from each other in the first direction and electrically connected by the first connection portion of a respective one of the first connection pad and the second connection pad.

15. The substrate of claim 14, wherein the first connection portion of each of the first connection pad and the second connection pad comprises a first sub-connection portion extending in the first direction and a second sub-connection portion extending in the second direction;
the first sub-connection portion is connected with each of the plurality of sub-pads of a respective one of the first connection pad and the second connection pad, and the second sub-connection portion is connected with the first sub-connection portion; and a width of the second sub-connection portion in the first direction is smaller than a length of the first sub-connection portion in the first direction.

\* \* \* \* \*